(12) United States Patent
Shen et al.

(10) Patent No.: US 8,168,962 B2
(45) Date of Patent: May 1, 2012

(54) METHOD AND APPARATUS FOR UNIFORMLY IMPLANTING A WAFER WITH AN ION BEAM

(75) Inventors: Cheng-Hui Shen, Hsin-Chu (TW); Don Berrian, Topsfield, MA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 183 days.

(21) Appl. No.: 12/539,558

(22) Filed: Aug. 11, 2009

(65) Prior Publication Data

US 2011/0037000 A1 Feb. 17, 2011

(51) Int. Cl.
*G21G 1/00* (2006.01)

(52) U.S. Cl. .................. 250/492.3; 250/396 R; 250/398; 250/400; 250/492.1; 250/492.2; 250/492.21; 250/492.22

(58) Field of Classification Search ............... 250/396 R, 250/398, 400, 491.1, 492.1, 492.2, 492.21, 250/492.22, 492.3
See application file for complete search history.

(56) References Cited

U.S. PATENT DOCUMENTS

| | | | |
|---|---|---|---|
| 6,677,599 B2 | 1/2004 | Berrian | |
| 7,161,161 B2 | 1/2007 | Renau et al. | |
| 7,166,854 B2 | 1/2007 | Renau et al. | |
| 7,375,354 B2 | 5/2008 | Iwasawa et al. | |
| 2008/0169434 A1* | 7/2008 | Ryding et al. | 250/492.21 |

FOREIGN PATENT DOCUMENTS

| | | |
|---|---|---|
| KR | 1019990075484 A | 10/1999 |
| KR | 1020000073648 A | 12/2000 |

* cited by examiner

*Primary Examiner* — Michael Maskell
*Assistant Examiner* — Hanway Chang
(74) *Attorney, Agent, or Firm* — Stout, Uxa, Buyan & Mullins, LLP

(57) ABSTRACT

Initially, an ion beam is formed as an elongated shape incident on a wafer, where the shape has a length along a first axis longer than a diameter of the wafer, and a width along a second axis shorter than the diameter of the wafer. Then, a center of the wafer is moved along a scan path intersecting the ion beam at a movement velocity, and the wafer is rotated around at a rotation velocity simultaneously. During the simultaneous movement and rotation, the wafer is totally overlapped with the ion beam along the first axis when the wafer intersects with the ion beam, and the rotation velocity is at most a few times of the movement velocity. Both the movement velocity and the rotation velocity can be a constant or have a velocity profile relative to a position of the ion beam across the wafer.

24 Claims, 14 Drawing Sheets

METHOD AND APPARATUS FOR UNIFORMLY IMPLANTING A WAFER WITH AN ION BEAM

FIELD OF THE INVENTION

The invention relates generally to ion implantation, and, in particular, to uniformly implanting an ion beam over a wafer by modifying a relative motion and a relative geometric relation between the wafer and the ion beam.

BACKGROUND OF THE INVENTION

An ion implantation process typically requires a uniform and consistent dose or amount of ions to be implanted into a wafer. Ion implantation processes also typically require a stable and uniform ion beam for implanting into the wafer. The dose is generally a function of ion beam current density and time that the wafer spends in front of an ion beam.

Because of larger and larger wafer sizes, recent semiconductor manufactures have moved towards processing one wafer at a time, in so-called single-wafer systems. In general, a so-called ribbon ion beam is employed by the single-wafer ion implantation. Clearly, when the required length of the ribbon beam is continually increased for larger and larger wafer sizes, it becomes more difficult to set up a ribbon ion beam meeting the required levels of uniformity in at least both beam intensities and angles. Therefore, there is a need for an improved method and apparatus capable of achieving uniform implantation in a single-wafer ion implanter without requiring extensive beam uniformity tunes.

A conventional technique entails simultaneously moving and rotating a wafer, which is larger than an ion beam, such that different portions of the wafer receive a substantially uniform dose. First, as shown in FIG. 1A, an ion beam 10 is formed with an elongated shape having a length and a width along two independent axes of the ion beam 10, and a wafer 11 is provided with a diameter larger than both the length and the width of the ion beam 10. Second, as shown in FIG. 1B, the wafer 11 is simultaneously rotated and moved across the ion beam 10. Clearly, the rotation of the wafer 11 can be used to ensure the wafer 11 is completely implanted by the ion beam 10, as the ion beam 10 is shorter than the diameter of the wafer 11. Moreover, as shown in FIG. 1C, different points on the wafer may have different rotation trajectories when a projection 12 of the ion beam 10 onto the wafer 11 is moved a unit distance (Δd), as can be discerned with reference to points A, B and C. Significantly, as shown in FIG. 1C, different points may have very different implantations during the different rotation trajectories. Therefore, to ensure that different points on the wafer have essentially equivalent implantation results, it is necessary for each point to be rotated around a center of the wafer at least one time, even integral times, during the unit distance Δd. In other words, the rotation velocity must be significantly higher than the movement velocity. Moreover, as shown in FIG. 1D, by comparison of how the rotary trajectories of points D, E and F are projected by the ion beam 10, the projected ratio of a corresponding rotation trajectory of a point is decreased as the distance between the point and the center of the wafer is increased. Therefore, to achieve subsequently equivalent implantations, the point having lower (higher) projection ratio should be projected for a longer (shorter) period of time. In other words, the movement velocity of the wafer 11 across the ion beam 10 must be higher when the ion beam is near the center of the wafer 11, and lower when the ion beam is near the edge of the wafer 11, as shown in FIG. 1E.

Another conventional technique is to scan an ion beam in multiple rotationally-fixed orientations of a wafer at movement velocities, such that different portions of the wafer receive substantially uniform doses. First, as shown in FIG. 2A, an ion beam 20 is formed as an elongated shape having a length and a width along two independent axes, and a wafer 21 is provided having a diameter with no relation to the length and the width. To emphasize the differences between this embodiment and the previous embodiment, the corresponding figures show the case where the diameter is larger than both the length and the width. Second, as shown in FIG. 2B, the wafer 21 is located on the left side of the ion beam 20 and has at least some separate points A, B, C and D. Third, as shown in FIG. 2C, the wafer 21 is moved through the ion beam 20 to the right side of ion beam 20. The wafer 21 is not rotated during the movement of the wafer 21. Fourth, as shown in FIG. 2D, the wafer 21 is rotated, such that the relative geometric relations among the ion beam 20 and the points A, B, C, D are changed. Fifth, as shown in FIG. 2E, the ion beam 20 is moved through the ion beam 20 to the left side of the ion beam 20, when the wafer 21 is not rotated during the movement of the wafer 21. After that, the above "movement-rotation-movement-rotation" process is repeated, until the wafer 21 is essentially uniformly implanted. When the number of repeated times is sufficient, the accumulated implantations on each of points A-D during the multiple rotationally-fixed orientations will essentially be equivalent. In other words, the final implantation result is independent of where the points A-D are in the beginning as shown in FIG. 2B.

However, these conventional technologies still have some non-negligible disadvantages. For the former conventional technology, the required rapid rotation may damage the wafer by a couple of different ways. For example, the fine scale structures formed on the wafer may not have sufficient structural integrity to withstand the centripetal acceleration, and the rotation can greatly add to the kinetic energy when particles collide with the wafer surface thus enhancing the destructive potential of the particles. Moreover, the mechanism for simultaneously moving and rotating the wafer is more complex than separately moving and rotating the wafer, especially when the rotation velocity is high. For the later conventional technology, the proper number of repetitions can be less than clear. Here, with more repetitions, implantation uniformity is increased but at the expense of decreased throughput. Clearly, the throughput will be significantly decreased when the ion beam is shorter than the diameter of the wafer or the stable portion of the ion beam is shorter than the diameter of the wafer, because many repeated times will be needed or desired to ensure different portions of the wafer are uniformly implanted.

Accordingly, there remains no ideal technology for uniformly implanting a wafer using a ribbon ion beam. A need thus exists to develop such a new technology for achieving this issue, especially to develop a new technology for effectively achieving this issue without significantly having to amend conventional technologies.

SUMMARY OF THE INVENTION

The present invention provides a method and an apparatus for uniformly implanting a wafer with an ion beam.

One feature of the invention is the relative geometric relation between the wafer and the ion beam. The length of the ion beam is not smaller than the diameter of the wafer. Moreover, when the wafer is moved to cross the ion beam, the wafer always is covered by the ion beam along the direction of the ion beam for each portion of the wafer. Therefore, the traditional rapid rotation of wafer for ensuring equivalent implantation over different portions of a wafer with a diameter larger than the ion beam length is not required. Of course, a rotation still is required to average other non-uniformities, such as the non-uniform ion beam current distribution along the length of the ion beam. However, the required rotation velocity is slow, because the rotation is only used to average a variation but is not used to average the implantation and non-implantation over the wafer as with the traditional fast wafer rotation. As a result, the rotation velocity is at most a few times of the movement velocity, and even can be slower than the movement velocity.

In another feature of the invention, when the wafer is moved along a scan path intersecting the ion beam with a movement velocity having a movement velocity profile to a position of the wafer, the movement velocity profile is adjustable without any specific limitation. For example, the movement velocity ratio between the center of the wafer and an edge of the wafer is not particularly restricted but can be larger than one, equal to one, or smaller than one. Note that the conventional rapid rotation of wafer requires the ratio always being larger than one, because the ratio that a point of the wafer is implanted by an ion beam during a rotation of the wafer is continuously decreased when projection of the ion beam is moved from the center of the wafer to the edge of the wafer. In contrast, the implanted ions are always distribution over the whole wafer in this invention, because the ion beam length is larger than or equal to the wafer diameter. Therefore, the movement velocity profile can be more variable for precisely adjusting the final implantation result.

Accordingly, the invention has a significant advantage in that the rotation velocity is slower than that of the conventional simultaneous movement and rotation, such that conventional defects induced by the fast rotation velocity can be avoided. Also, the wafer is always simultaneously rotated and moved during ion implantation of the wafer, such that conventional defects induced by no-rotation or multiple rotationally-fixed orientations can be improved.

In addition, the rotation velocity may be lower than the movement velocity, when said rotation velocity is defined by a tangential velocity parallel to said scan path on an edge of said wafer. Moreover, to further improve the overall uniformity of the implantation, it is optional to rotate the wafer for an angular magnitude 360 P/Q degree during the time when the wafer is moved through a scan path, wherein P is a positive integer and Q also is a positive integer. As example, P can be 1 and Q can be the total scan number.

Another feature of the invention is that both the rotation velocity and the movement velocity can be a constant or a velocity profile to a position of the wafer. Hence, the final implantation result over the wafer can be adjusted by adjusting one or more of the movement velocity and the rotation velocity.

Another feature of the invention is that each of the movement velocity profile and the rotation velocity profile can be decided using one or more of the following factors: the ion beam current density distribution, especially the distribution along the length of the ion beam, the forecasted final implantation result over the wafer, and the predetermined scan paths.

A further feature of the invention is an approach for repairing error during the period of simultaneously moving and rotating the wafer. Whenever an error, such as a glitch or an instability of the ion beam, is detected, the error position is recorded and the ion beam is blocked immediately. After that, both the movement and the rotation of the wafer are continued with the blocked ion beam until an end of the current scan path arrives. Then, both the movement and the rotation are reversed with unblocked ion beam until the error position arrives, such that the whole current scan path is implanted with proper ion beam. Finally, the ion beam is blocked immediately again until the ion beam is projected on the end of the current scan path, such that the whole ion implantation can be performed with little to no error.

A related feature of the invention is an approach for repairing secondary error during the above repairing approach. Whenever a secondary error, such as a glitch or an instability of the ion beam, is detected during the reversed movement and reversed rotation, the secondary error position is recorded and the ion beam is blocked immediately. After that, both the reversed movement and the reversed rotation of the wafer with the blocked ion beam are continued until the reversed scan of the current scan path is finished. Next, both the movement and the rotation with blocked ion beam are proceeded again until the error position arrives. Then, the ion beam is not blocked when both the movement and the rotation are proceeded until the secondary error position has arrived, such that the whole current scan path is implanted with proper ion beam. Finally, the ion beam is blocked immediately again until the ion beam is projected on the end of the current scan path, such that the whole ion implantation can be performed without error.

A further feature of the invention is that the wafer can be tilted when the wafer is simultaneously moved and rotated. The tilt angle can be fixed or varied within predetermined angle range. During the tilting, the wafer can be rotated around a direction parallel to the ion beam or another direction vertical to the wafer. Hence, the implantation angle of the ion beam on the wafer can be fixed or adjusted.

An apparatus for achieving the above features at least has an ion beam assembly for proving the ion beam, a wafer movement driver operative to move the wafer, a wafer rotation driver operative to rotate the wafer, and a controller operative to operate the ion beam assembly, the wafer movement driver and the wafer rotation wafer. The ion beam assembly, the wafer movement driver and the wafer rotation driver can be any commercially available or equivalent product. Herein, a key is the controller that can operate the ion beam assembly, the wafer movement driver and the wafer rotation wafer to achieve the above features. Note that the details of the controller are not limited to those mentioned; it can be an integrated circuit, a program code executed by a computer, another equivalent device, and so on.

The apparatus can have some elements for blocking the ion beam, such as blanker, deflector and switch. It also can have a wafer tilting driver for tilting the wafer.

BRIEF DESCRIPTION OF THE DRAWINGS

The embodiments of this invention will be described in detail below, with reference to the following figures, wherein like designations denote like elements, and wherein.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that the intent is not to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without at least one of these specific details. In other instances, well-known process operations are not described in detail in order not to obscure the present invention.

Figure 3:
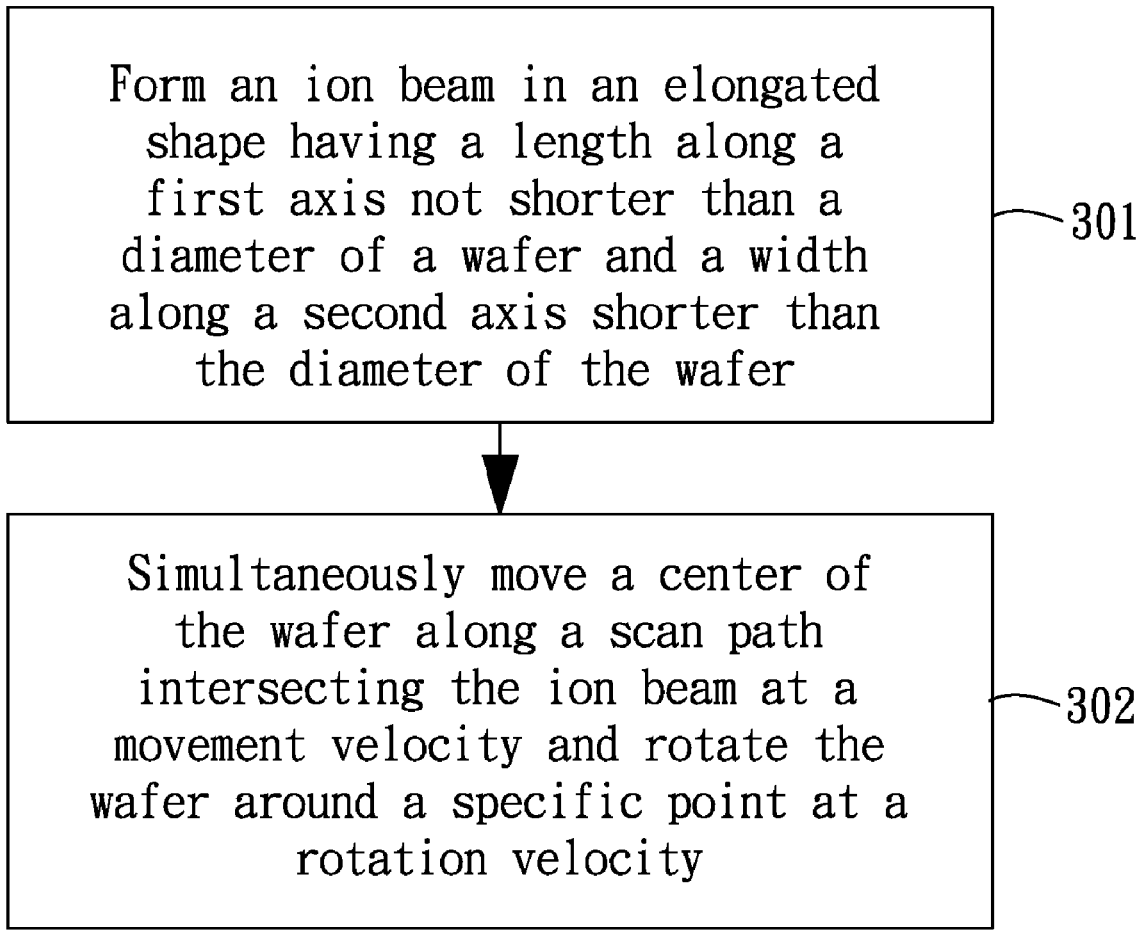
FIG. 3 is the flowchart diagram of one embodiment of this invention.

One embodiment is a method of implanting a wafer as shown in FIG. 3. First, as shown in block 301, an ion beam is formed in an elongated shape having a length along a first axis not shorter than a diameter of a wafer and a width along a second axis shorter than the diameter of the wafer. Then, as shown in block 302, a center of the wafer is simultaneously moved along a scan path intersecting the ion beam at a movement velocity and the wafer is rotated, such as around the center of the wafer, at a rotation velocity.

As examples, an ion beam longer than a diameter of a wafer can be viewed as the uniform portion of the ion beam being longer than the diameter of the wafer, or viewed as the uniform portion of the ion beam being lower than the diameter of the wafer when the amount of the ion beam current still is detectable on the edge of the wafer. In contrast, in the prior art shown in FIGS. 1A to 1E, the required limitation "an ion beam is shorter than a diameter of a wafer" means that the whole ion beam is dropped to zero, or at least not detectable, on the edge of the wafer.

Figure 4A:
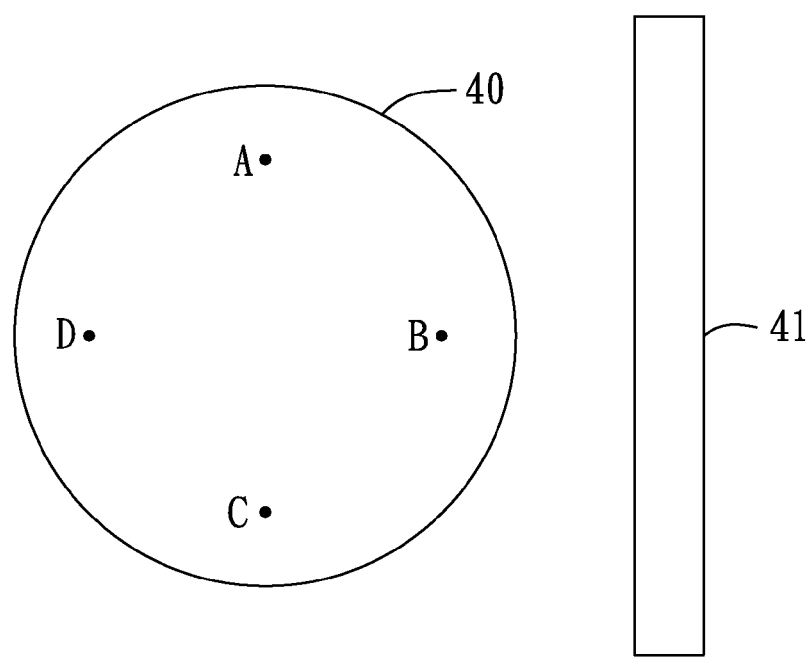
FIGS. 4A to 4F illustrate the operation of an embodiment of this invention.
Figure 4B:
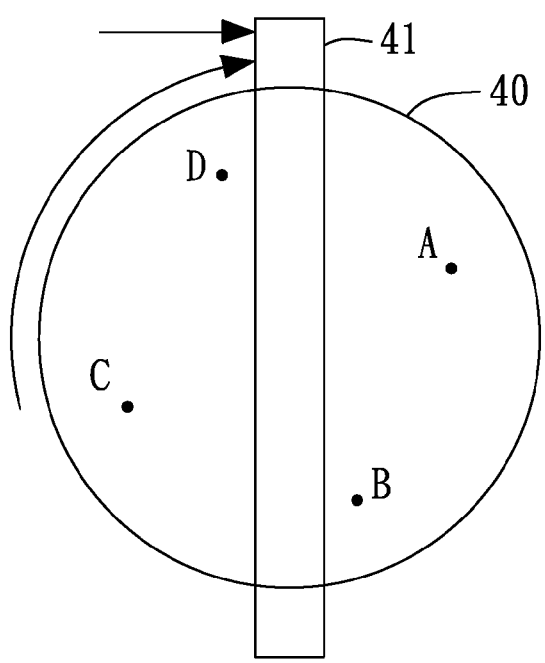
Figure 4C:
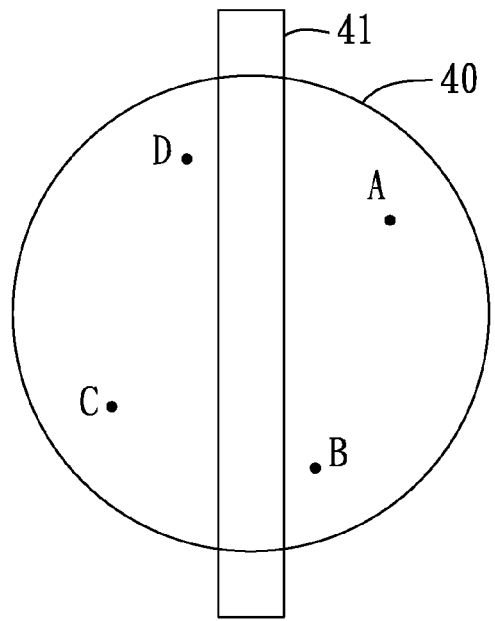
Figure 4D:
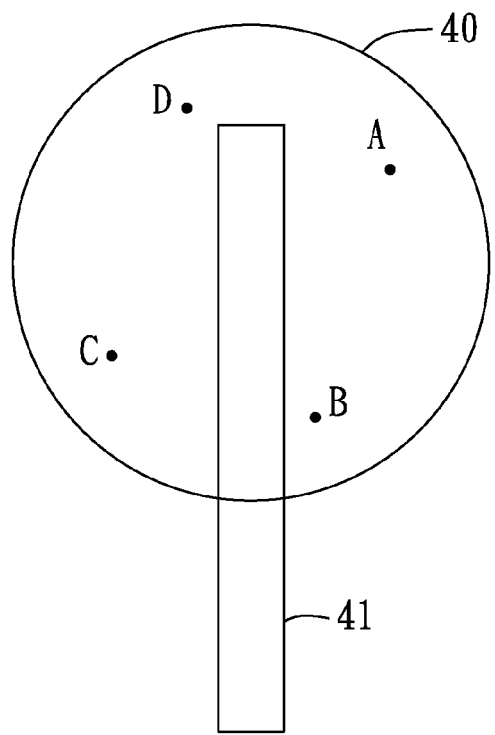
Figure 4E:
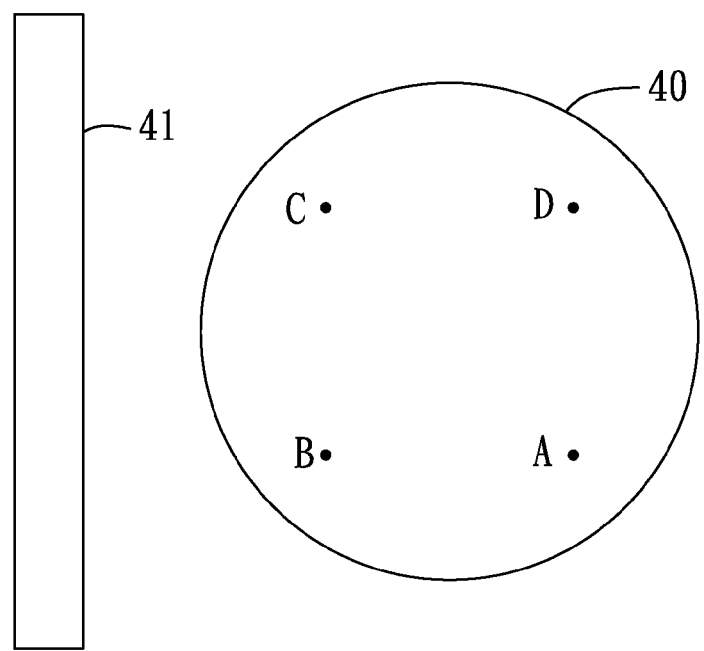
Figure 4F:
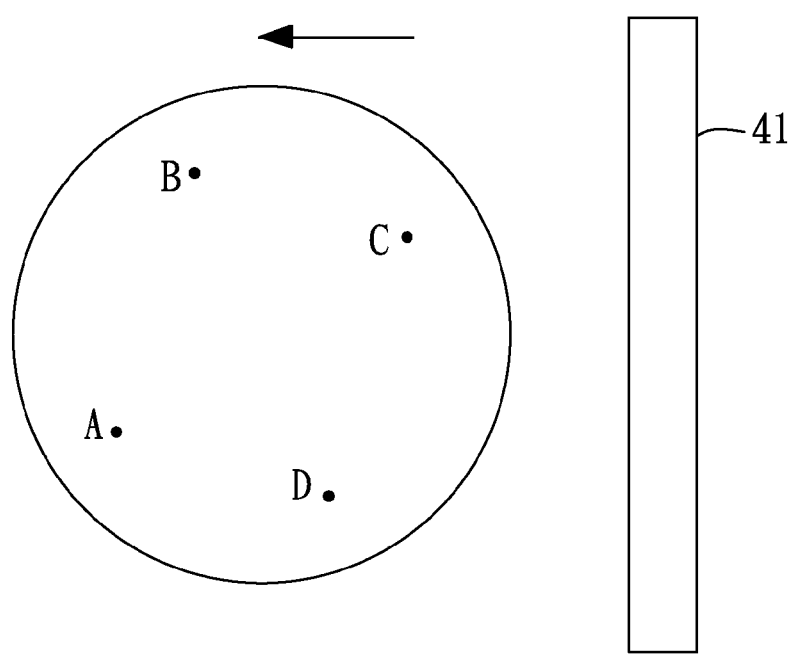

According to an aspect of the invention, an essential mechanism of the method, in addition to that elucidated in the referenced figure, can be further explained as below. First, as shown in FIG. 4A, a wafer 40 is provided with some points A, B, C, and D, and an ion beam 41 is provided beside (e.g., at the right side of) the wafer 40. The length of the ion beam 41 is larger than or equal to the diameter of the wafer 40, but the width of the ion beam 41 is shorter than the diameter of wafer 40. Then, as shown in FIG. 4B, the wafer 40 is simultaneously moved and rotated across the ion beam 41. Here, the movement direction usually is essentially parallel to a short axis of the ion beam 41. Indisputably, the wafer 40 is totally overlapped with the ion beam 41 along the long axis of the wafer 40 when the wafer 40 intersects with the ion beam 41. The wafer 40 may be moved at an angle, as shown in FIG. 4C, but when a point of the wafer 40 is located right under the ion beam 41 all points of the wafer 40 along a line passing the point and parallel to the long axis of the ion beam 41 must be located right under the ion beam 41. In other words, according to a feature of the invention, the case shown in FIG. 4D is not acceptable. Further, the method does not have a preference for clockwise or counterclockwise rotation, with FIG. 4B only showing a sample with clockwise rotation direction. Third, as shown in FIG. 4E, the wafer 40 is located at the other side (e.g., the right side) of the ion beam 41 after the simultaneous movement and rotation. Here, the rotation times during the simultaneous movement and rotation are not limited. Fourth, as shown in FIG. 4F, by simultaneously moving and rotating again by reversing the movement direction but keeping the rotation direction, the wafer 40 is located at the other (e.g., the left) side of the ion beam 41 again. The embodiment only requires reversing the movement direction; whether to reverse, in particular, the rotation direction when the movement direction is reversed is optional for this invention. By repeating the steps shown in FIGS. 4A-4B and 4E-4F several times, full rotation can ensure that the wafer 40 is uniformly implanted by the ion beam 41.

Figure 1A:
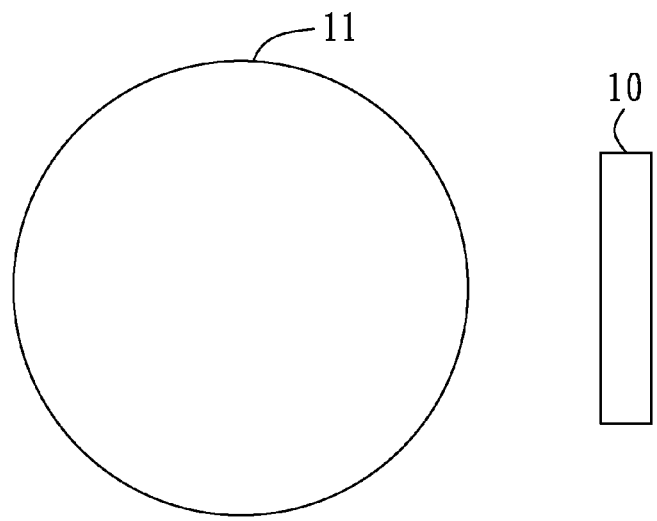
FIGS. 1A to 1E illustrate the operation and one characteristic of one prior art technique.
Figure 1B:
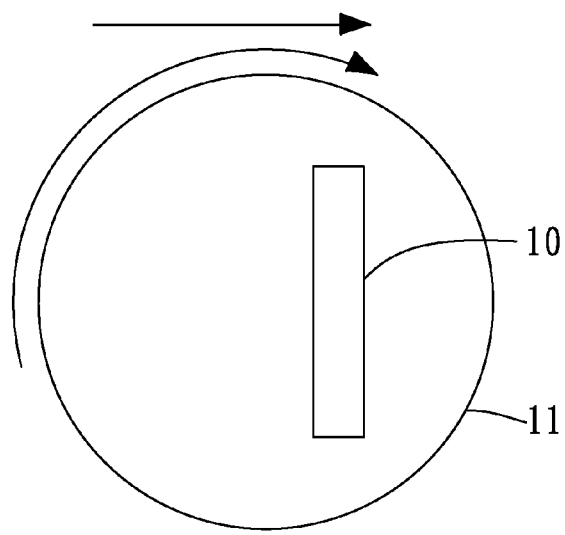
Figure 1C:
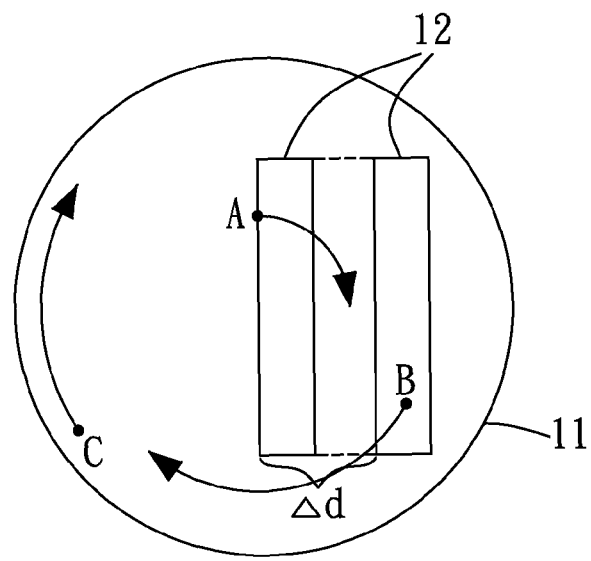

One characteristic of the embodiment can be easily found by at least comparing FIG. 1C with FIG. 4B. In the prior art, without rotation, some portions of the wafer 11 will be implanted by the ion beam 10, but other portions of the wafer 40 will never be implanted by the ion beam. Hence, according to a feature of the invention, the required rotation velocity must be high enough so as to let portions of the wafer 40 be implanted and not implanted alternately during the simultaneous moving and rotating step. In contrast, in this embodiment, all portions of the wafer 40 will always be implanted by the ion beam 41 even without rotation. Hence, rotation essentially is only used to average the possible fluctuation of the ion beam current distribution, and then the required rotation velocity will be significantly lower than the prior art. For example, the rotation velocity is at most a few times of the movement velocity. As another example, the rotation velocity is lower than the movement velocity, or the rotation time is less than one when the wafer is moved from one side of the ion beam to another side of the ion beam. A simple way to compare the rotation velocity and the movement velocity is to calculate a difference between a tangential velocity parallel to the scan path on an edge of the wafer and a velocity of the center of the wafer along the scan path. As an example, the rotation velocity is slower than the movement velocity, when the rotation velocity is defined by a tangential velocity parallel to the scan path on an edge of the wafer. As an example, an angular magnitude of the rotation velocity is 360 P/Q degrees during a period that the wafer is moved through the scan path, wherein P is a positive integer and Q is also a positive integer. For example, P is 1 and Q is the total scan number.

Figure 1D:
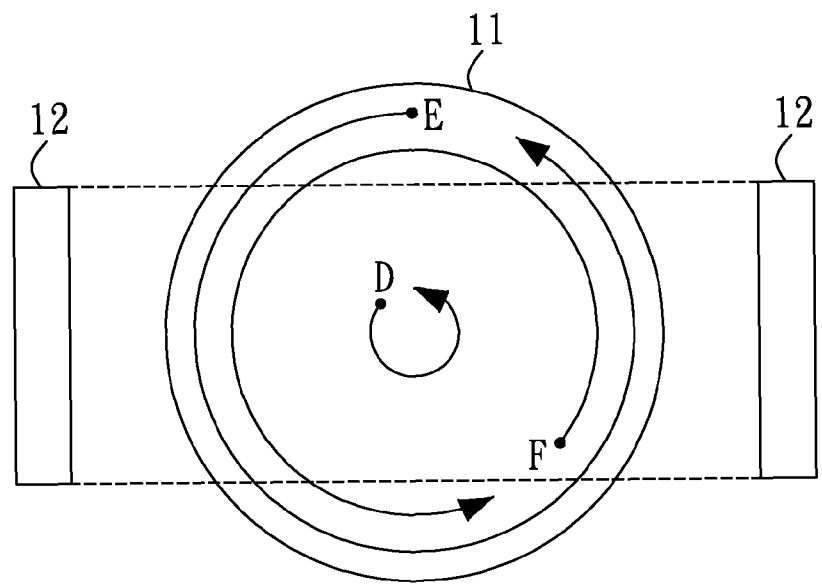
Figure 1E:
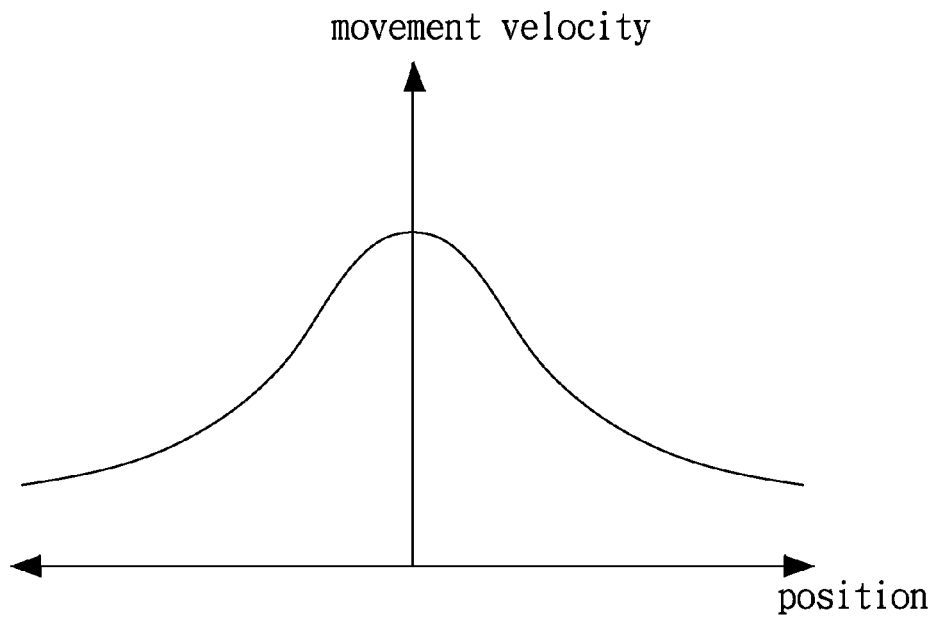
Figure 2A:
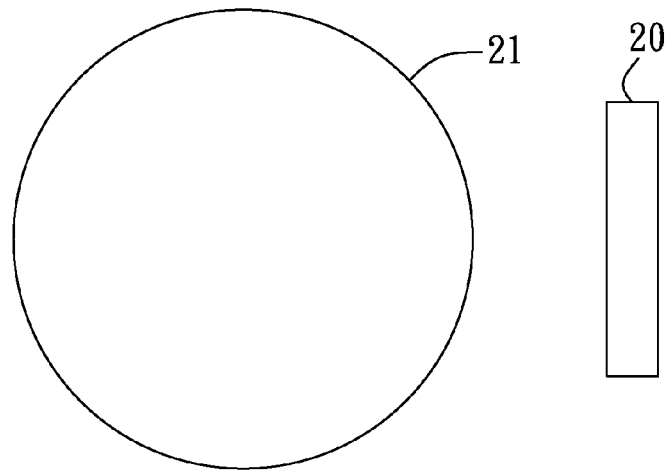
FIGS. 2A to 2E illustrate the operation of another prior art implementation.
Figure 2B:
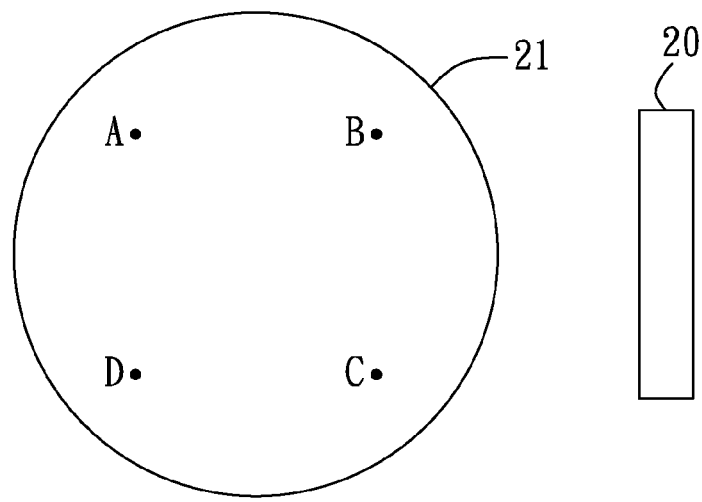
Figure 2C:
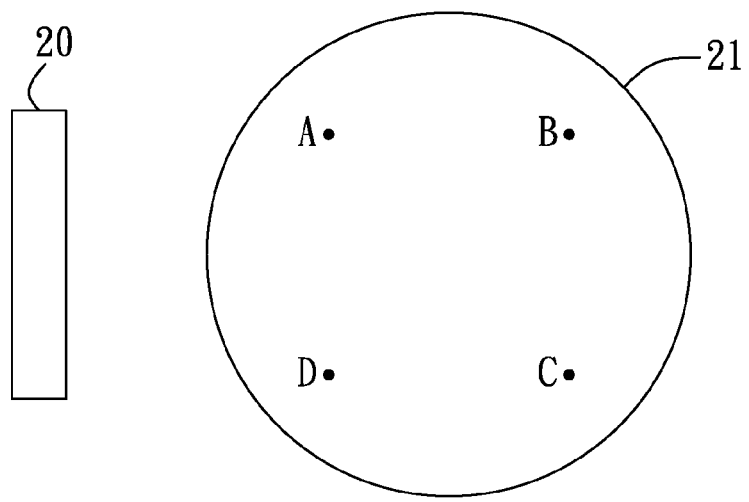
Figure 2D:
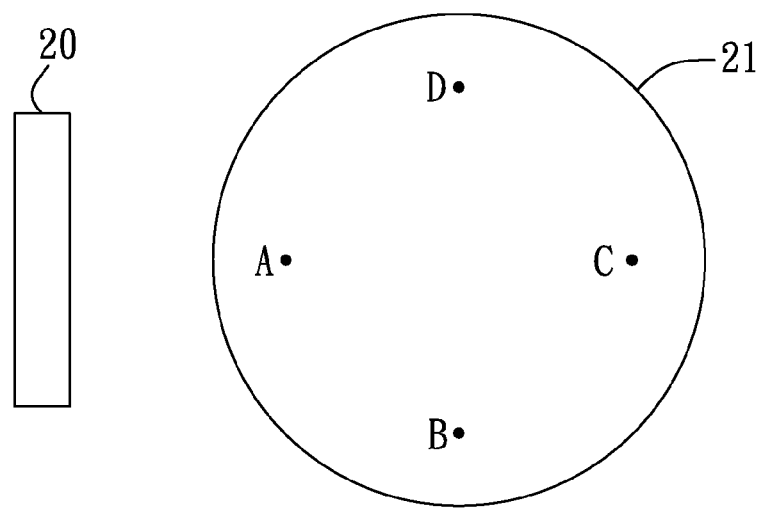
Figure 2E:
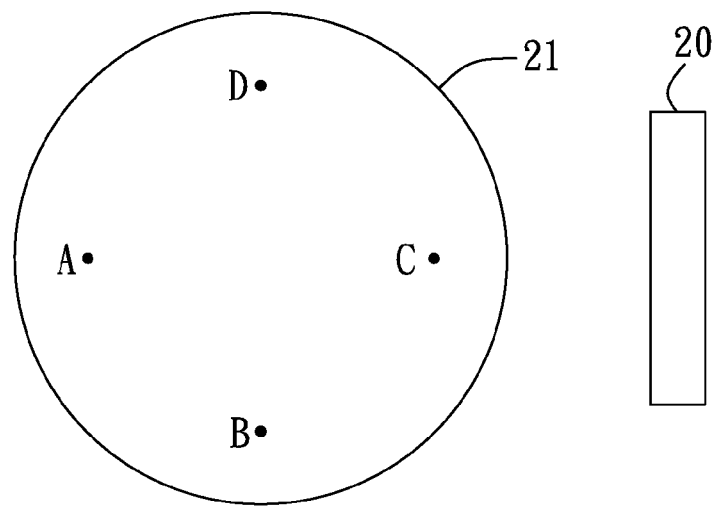

Another characteristic of the embodiment is evidenced by comparing FIG. 1D with FIG. 4B. In the prior art, during rotation, different portions of the wafer 11 have different implantation ratios, with portions closest to the center of the wafer 11 almost always being implanted during rotation, and portions close to the edge being at most partially implanted during the rotation. Hence, to ensure uniform implantation over the wafer 11, the movement velocity of the wafer 11 must be highest when the center of the wafer 11 is being implanted and lowest when (e.g., gradually decreased until only) the edge of the wafer 11 is being implanted. In contrast, in the current embodiment, the implantation ratios of different portions of the wafer 40 during rotation will always be equivalent. Hence, the movement velocity of the wafer 40 along the scan path across the ion beam 41 need not be adjusted to balance any non-uniformity induced by the different implantation ratios over different portions of the wafer 40. As an example, the simultaneously moving and rotating step can be chosen from one or more of a group comprising or consisting of the following: (a) moving the wafer 40 with a faster movement velocity when the ion beam 41 implants the center of the wafer 40, and with a slower movement velocity when the ion beam 41 only implants an edge of the wafer 40; (b) moving the wafer 40 with a slower movement velocity when the ion beam 41 implants the center of the wafer 40, and with a faster movement velocity when the ion beam 41 only implants an edge of the wafer 40; and (c) moving the wafer 40 with about the same (e.g., an essentially similar) velocity regardless of whether the ion beam 41 is implanting at the center of the wafer 40 or at an edge of wafer 40.

Indeed, considering the movement velocity profile and the rotation velocity profile relative to a position of the wafer 40 across the ion beam 41, there is no specific non-uniformity in need of being cancelled by averaging. Thus, not only does the movement velocity have no specific contour as with the prior art shown in FIG. 1E, but also the rotation velocity has no specific contour. Accordingly, both the movement velocity profile and the rotation velocity profile can be flexibly adjusted or fixed, such that implantation of the ion beam 41 over the wafer 40 is improved.

The simplest movement velocity profile is a constant movement velocity, which is suitable for a very stable and uniform ion beam 41 and a wafer 40 having very uniform patterns. However, in the practical world, where many factors are non-uniform over different portions of the wafer 40 or non-stable during the simultaneous rotation and movement, the movement velocity is a function of one or more of some possible factors such that non-uniform or non-stable factor(s) can be cancelled by averaging. As an example, possible factors may be a current density distribution of the ion beam 41 along the first axis, a current density distribution of the ion beam 41 along a direction intersecting the first axis, a forecasted implanted dose distribution over the wafer 40, a net current density distribution along the first axis per a predetermined scan path, a net current density distribution along a direction intersecting the first axis per a predetermined scan path, and so on. Similarly, although the rotation velocity usually is a constant velocity, the rotation velocity profile still can be a function of one or more of the above possible factors.

One main characteristic of the invention is using one or more of the "predetermined scan path" and the "forecasted implanted dose distribution" as a factor of calculating one or more of the movement velocity profile and the rotation velocity profile. The "ion beam current distribution" and the "quality of the wafer to be implanted" have been popularly used to calculate the velocity profile in the prior art, but the usage of the two factors is newly provided by this invention.

Although the wafer 40 is moved along a scan path having a straight-line shape in the above embodiment, the invention is not so limited. Indeed, as with conventional two-dimensional scanning, the shape of the scan path can be straight-line or arcuate.

Further, in this embodiment, the wafer 40 is moved along the scan path such that the ion beam 41 implants from an edge of the wafer 40 through the center of the wafer 40 to an opposite edge of the wafer 40. However, the invention also allows for the wafer 40 to be moved along a scan path not from an edge to an opposite edge, but rather from a portion of the wafer 40 to another portion of the wafer 40. Clearly, when the rotation velocity is high enough and/or the repeated times of simultaneous moving/rotating are high enough, the final implantation will still be uniform enough.

Furthermore, while the above embodiment describes the wafer being repeatedly backwardly and forwardly moved along only one scan path, the invention allows different scan paths to be used in sequence. Two ends of a next scan path can be different than two ends of a previous scan path when a movement/rotation of the wafer 40 along the previous scan path is finished and a movement/rotation of the wafer along the next scan path is to begin.

According to a typical but not required or limiting implementation, the ending point of the previous scan path is the starting point of the next scan path. Besides, different scan paths can correspond to different movement velocity profiles and different rotation velocity profiles, because the implantations among different scan paths are capable of being separately operated.

To reduce the amount of channeling, the wafer 40 can be tilted when the wafer 40 is simultaneously moved and rotated. Of course, for this object, it also is possible to tilt the ion beam 41 when the wafer 40 is simultaneously moved and rotated, although it may be preferred or more popular to tilt the wafer 40 but not the ion beam 41.

Figure 5A:
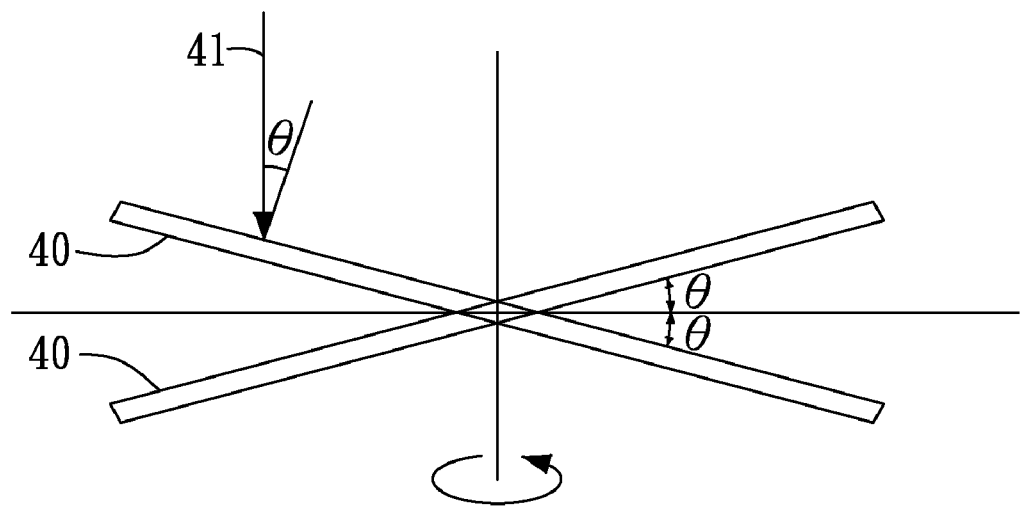
FIGS. 5A to 5D illustrate the operation of an embodiment of this invention.
Figure 5B:
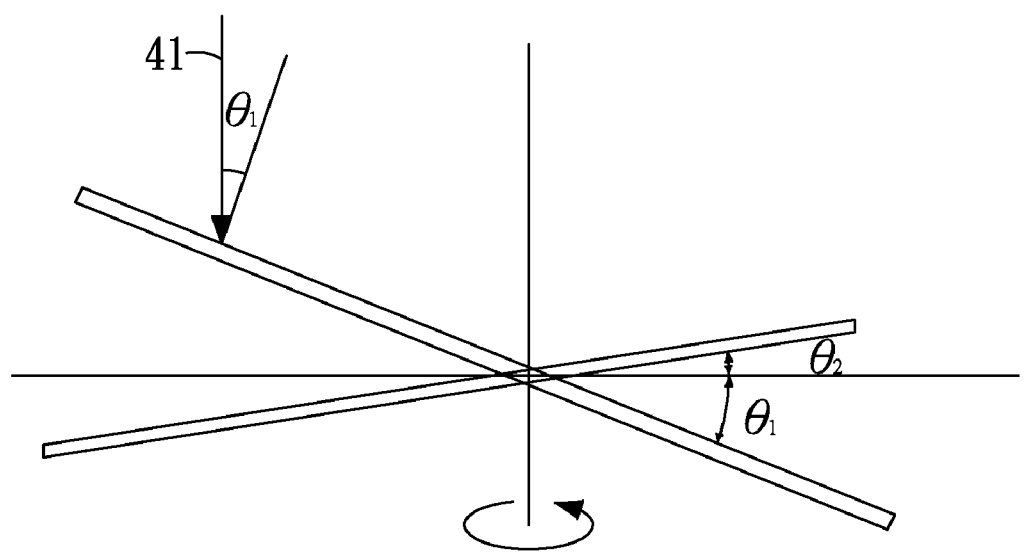
Figure 5C:
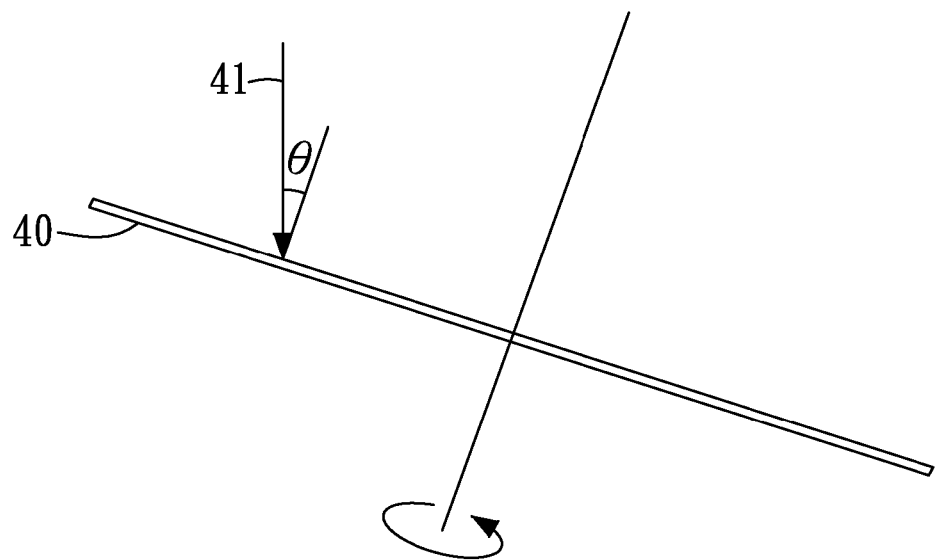
Figure 5D:
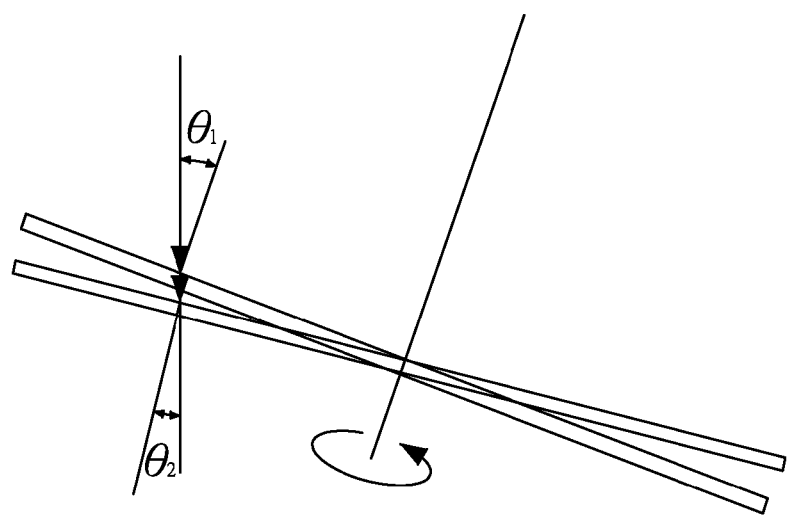

Typically, the wafer 40 is tilted at a fixed tilt angle as shown in FIGS. 5A and 5C, wherein the tilt angle usually is several degrees from vertical or from the direction of the ion beam 41. However, the invention also allows the tilt angle to be varied within a predetermined angle range, as shown in FIGS. 5B and 5D. For varied tilt angle ranges, an advantage is eliminating a risk that all implanted regions over the wafer 40 have a common oblique angle (owing to a non-vertical implanting ion beam 41), but a disadvantage is longer rotation time being required to ensure all implanted regions over the wafer have equivalent implanted regions (with equivalent direction).

When the wafer 40 is tilted, the wafer 40 can be rotated around a direction (e.g., axis) parallel to the ion beam 41, as shown in FIGS. 5C and 5D, and also can be rotated around a direction parallel to a vector normal to the wafer surface, as shown in FIGS. 5A and 5B. The former can provide variance relative to the crystal axis with different positions of the wafer 40, but requires a slightly complex mechanism to rotate the wafer 40. The latter may induce varied tilt angles over different positions of the wafer 40, but the required mechanism to rotate the wafer 40 is simpler and cheaper.

Furthermore, the ion beam usually is not always stable. Some errors, such as glitches or instabilities of the ion beam, are unavoidable. In the prior art shown in FIGS. 2A to 2E, the scan path for each rotation-fixed orientation is a straight line, and the wafer is not rotated during movement along a rotation-fixed orientation. Hence, the implantation can continue as soon as the repair of the ion beam is complete, because the implantation result is not a function directly of whether a line is implanted going left to right or right to left. In the prior art shown in FIGS. 1A to 1E, the continuous rotation induces a complication caused by having both movement and rotation implemented at the same time, and continuance of the implantation as soon as the repair of the ion beam is attempted cannot properly achieve the same implantation as if the error never happened. However, because the rotation speed is higher than the movement speed in the prior art, the damage induced by the errors may be acceptable if the period of errors is short enough (i.e., the quality of the ion beam is not too bad).

Figure 6:
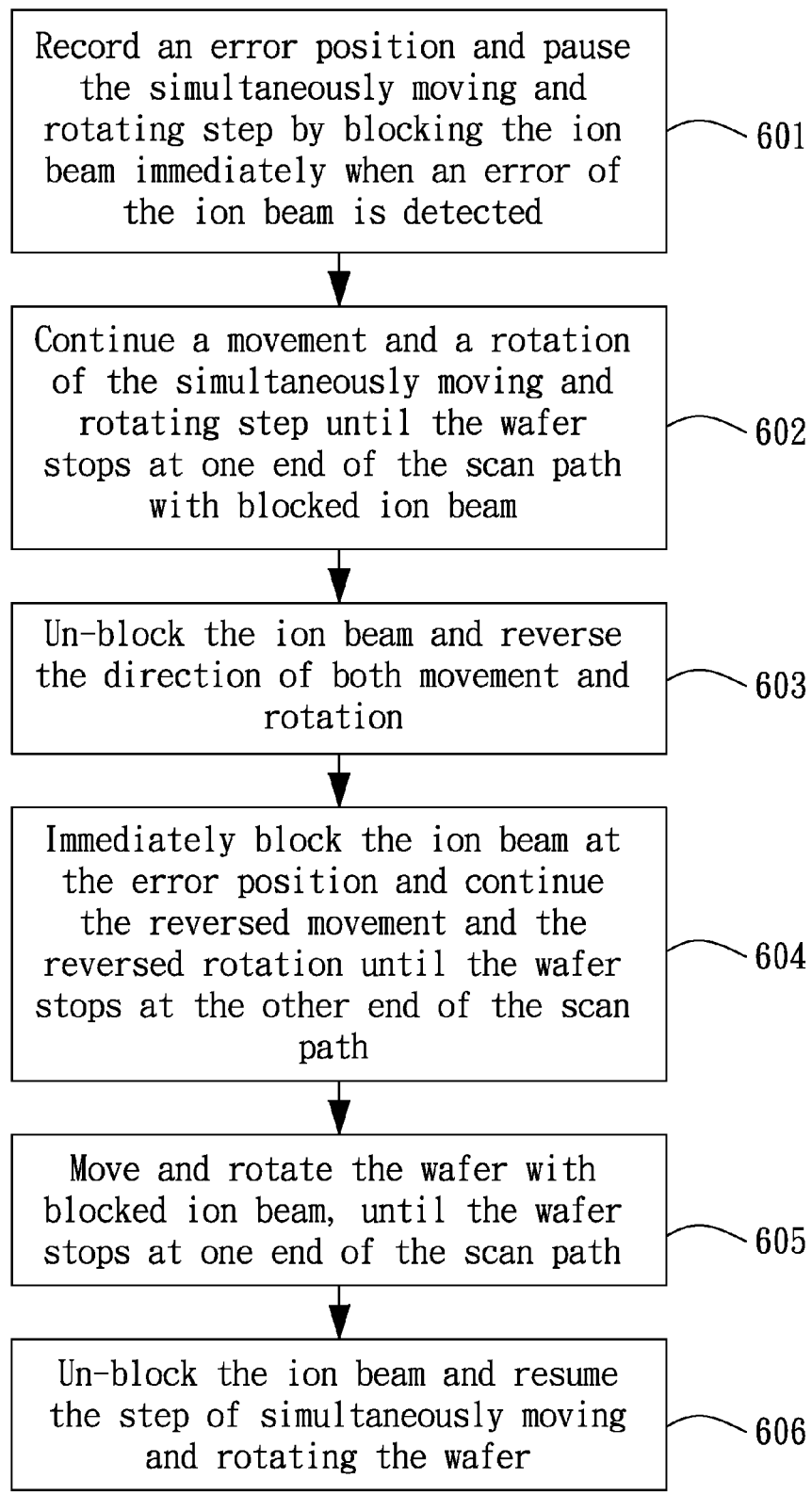
FIG. 6 is the flowchart diagram of one embodiment of this invention.

However, in the above embodiment, the rotation velocity, which is at most a few times of the movement velocity, can be even slower than the movement velocity. Hence, damage induced by the errors will be significant. Therefore, another embodiment of the invention is a method for repairing error during a period of simultaneously moving and rotating the wafer. As shown in FIG. 6, the embodiment has one or more of the following steps:

Initially, as shown in block 601, an error position is recorded, with pausing of the simultaneous moving and rotating step occurring through blocking of the ion beam immediately when an error of the ion beam is detected. Next, as shown in block 602, a movement and a rotation of the simultaneous moving and rotating step are continued until the wafer stops at one end of the scan path (with the ion beam still blocked). Then, as shown in block 603, the ion beam is unblocked, and the direction of both movement and rotation is reversed. After that, as shown in block 604, the ion beam is blocked immediately/precisely at the error position and the reverse movement and the reverse rotation are continued until the wafer stops at the other end of the scan path. Then, as shown in block 605, the wafer is moved and rotated with the ion beam blocked until the wafer stops at one end of the scan path. Finally, as shown in block 606, the ion beam is unblocked and the step of simultaneously moving and rotating the wafer is resumed.

Moreover, it is possible that another error may occur during the above steps for repairing error during a period of simultaneously moving and rotating the wafer. Hence, if a secondary error, such as glitch or instability of the ion beam, occurs during the above steps for repairing error, the embodiment may further have one or more of the following steps. Of course, if no secondary error occurs, then the embodiment only continuously monitors the ion beam during the steps of repairing error.

Figure 7:
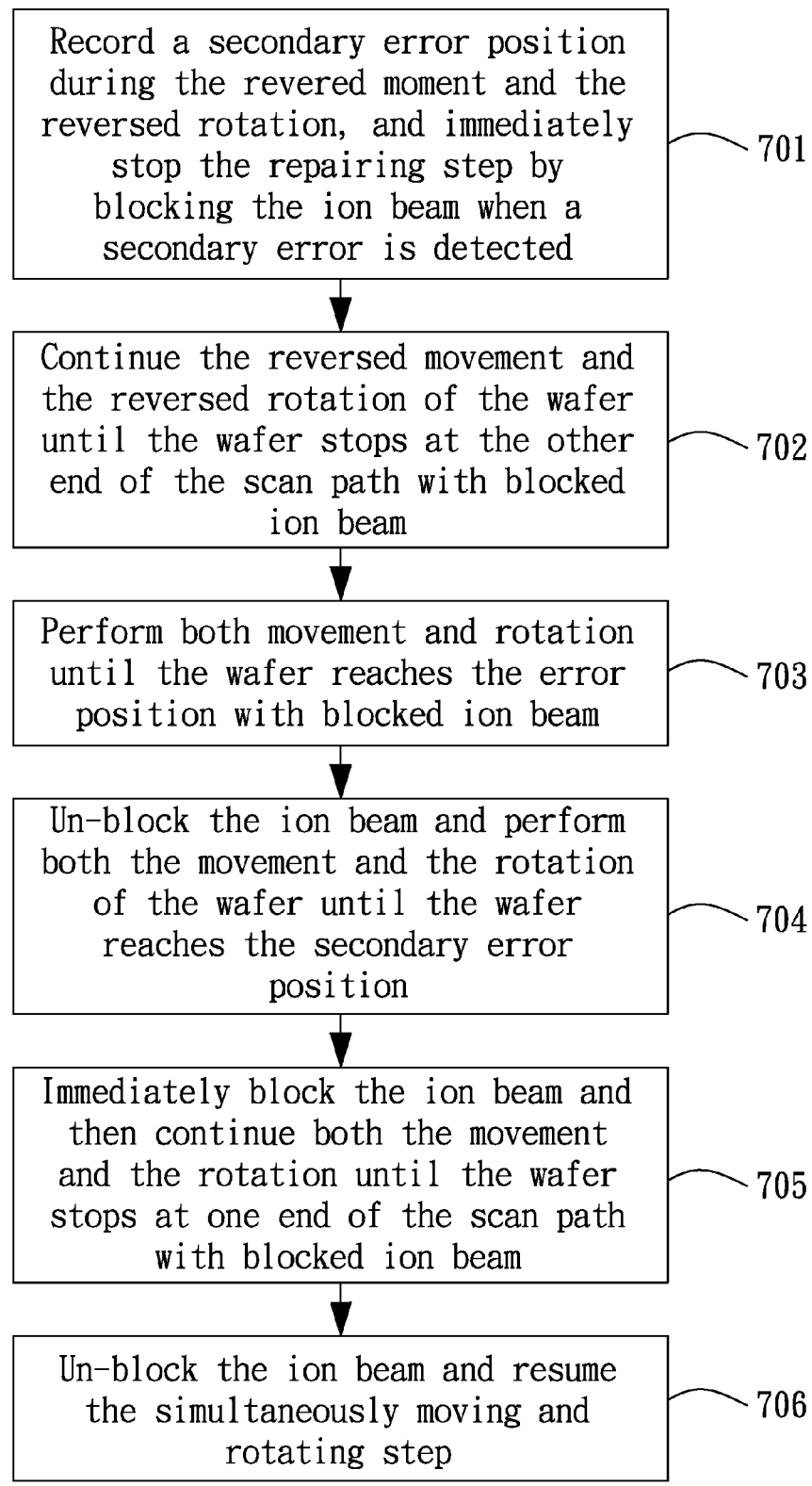
FIG. 7 is the flowchart diagram of an embodiment of this invention.

By referring to FIG. 7, initially, as shown in block 701, record a secondary error position during the reversed moment and the reversed rotation, and immediately stop the repairing step by blocking the ion beam when a secondary error is detected. Next, as shown in block 702, continue the reversed movement and the reversed rotation of the wafer until the wafer stops at the other end of the scan path with the blocked ion beam. Then, as shown in block 703, perform both movement and rotation until the wafer reaches the error position with the blocked ion beam. After that, as shown in block 704, unblock the ion beam and perform both the movement and the rotation of the wafer until the wafer reaches the secondary error position. Then, as shown in block 705, immediately block the ion beam and continue both the movement and the rotation until the wafer stops at one end of the scan path with the blocked ion beam. Finally, as shown in block 706, unblock the ion beam and resume the simultaneous moving and rotating step.

The mechanism of the embodiment can be briefly summarized as follows: keep the scan path fixed but switch the implantation of the ion beam. If an error is found, the scan path will be scanned with blocked ion beam first, and then the scan path will be scanned backwardly and forwardly again to provide a chance for finishing the incomplete implantation. Here, to prevent an ion beam with glitch or instability from implanting, the ion beam is blocked immediately when an error of the ion beam is detected. Then, when the ion beam is moved backwardly and forwardly along the scan path and over a portion of the scan path which should be implanted, the ion beam implants to ensure that whole scan path has a complete implantation.

The location of the error and the end (finishing terminal) of the scan path indicates the portion of the scan path which should be implanted but not implanted owing to the appeared error of ion beam. Of course, if another error (namely, a secondary error) occurs during the implantation over the portion, the above mechanism can be applied to repair the secondary error by using the position of the error and the position of the secondary error to indicate another portion of the scan path which should be implanted but not implanted owing to the appeared error and secondary error of ion beam. Without question, no matter how many errors appear, the above mechanism can be repeatedly used to repair these errors.

To ensure uniform implantation, it is necessary that the ion beam has essentially similar ion beam current distribution along the scan path. Owing to the period of the glitch or instability usually is very short, the above embodiment directly uses the ion beam after it is blocked to filter out the effect of the error. However, the above embodiment also can use the ion beam only after the state of the ion beam is essentially equal to the state of the ion beam before the error occurs. In other words, the ion beam is monitored before an implantation of the ion beam, especially the unblocked ion beam, is performed.

In addition, the way used to block the ion beam is not limited. It can comprise one or more of blanking the ion beam, deflecting the ion beam, or just directly turning-off the ion beam.

Figure 8:
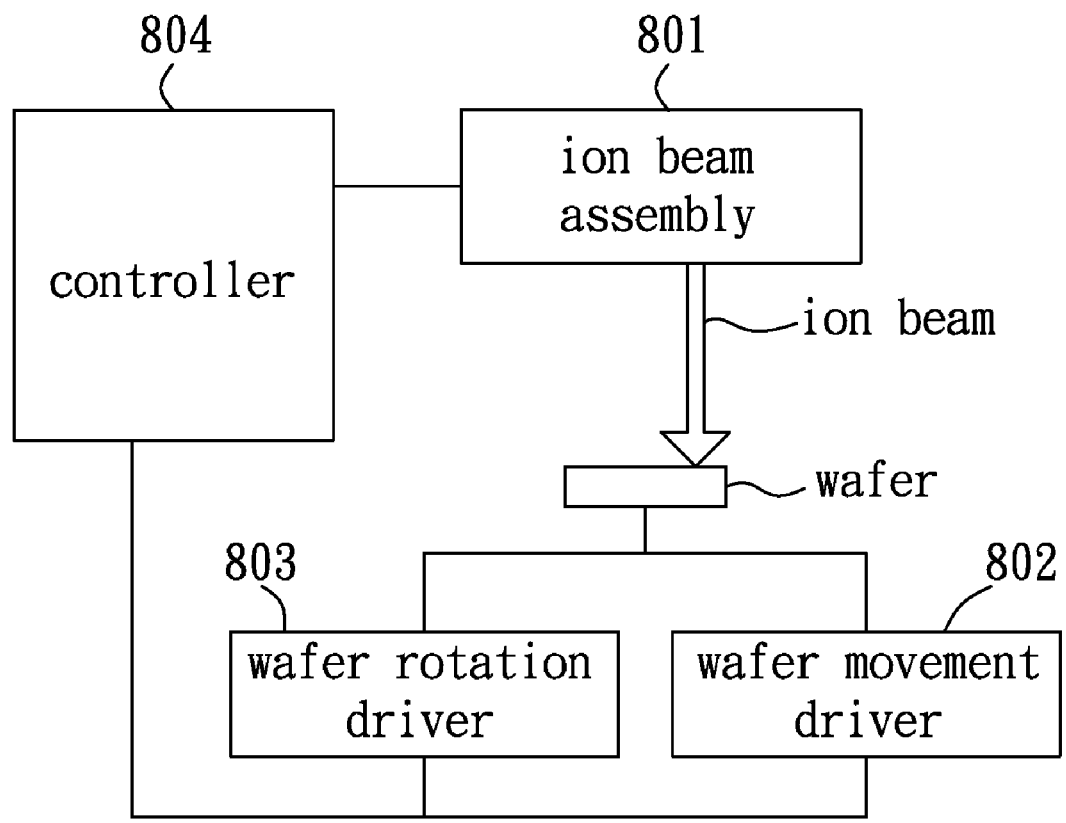
FIG. 8 is a block diagram of an embodiment of this invention.

A further embodiment is an apparatus for ion implantation of a wafer with a center and a diameter. The apparatus is capable of proceeding with and performing all embodiments disclosed above. As shown in FIG. 8, the embodiment at least has an ion beam assembly 801, wafer movement driver 802, wafer rotation driver 803, and controller 804. The ion beam assembly 801 is used to provide an ion beam for implanting a wafer. The wafer movement driver 802 is operative to move the center of the wafer along a scan path intersecting the ion beam at a movement velocity as the wafer crosses the ion beam, wherein the movement velocity has a movement velocity profile relative to a position of the wafer across the ion beam. The wafer rotation driver 803 is operative to rotate the wafer at a rotation velocity as the wafer crosses the ion beam, wherein the rotation velocity has a rotation velocity profile relative to a position of the wafer across the ion beam. The controller 804 is configured to operate the ion beam assembly 801, the wafer movement driver 802, and the wafer rotation wafer 803, such that the ion beam has an elongated shape with a length along a first axis longer than the diameter of the wafer and a width along a second axis shorter than the diameter of the wafer, such that the wafer is totally overlapped with the ion beam along the first axis as the wafer crosses the ion beam and such that the rotation velocity is at most a few times of the movement velocity.

As an example, the ion beam assembly 801 usually at least has an ion source and an analysis magnet unit. For instance, the wafer movement driver 802 may have a holder for holding a wafer and both a motor and a roller chain for moving the holder along a rail. In a particular implementation, the wafer rotation driver 803 may embody a motor and a supporting rod for rotating the holder around the supporting rod.

However, the prior art disclosed above can move the wafer and rotate wafer, and the above embodiment never requires specific movement or rotation (such as a very high rotation velocity or a very complex movement path). Hence, the details of the ion beam assembly 801, the wafer movement driver 802, and the wafer rotation driver 803 are not key to the embodiment, and thus are not to be limited to the disclosed embodiment. Indeed, any well-known, on-developing or to-be-developed technologies can be used.

Clearly, a key according to one feature of the invention is the controller 804. Note that the controller 804 is not intended to be limited by its structure or implementational/nonconsequential functions, i.e., how the controller 804 achieves the method disclosed in the above embodiments, but rather by its ultimate functions such as emphasized and claimed herein. Hence, the details of the controller 804 are not limited; it can be an integrated circuit, a program code executed by a computer, another equivalent device, and so on.

As a short summary, the controller 804 is cable of achieving at least one (e.g., or more, or all) of the following functions:

(a) Control the ion beam assembly 801 to adjust the length of the ion beam to be larger than the diameter of the wafer.

(b) Control the wafer movement driver 802 and the wafer rotation driver 803 to adjust a tangential component of the rotation velocity parallel to the scan path on an edge of the wafer to be at most a few times of a movement velocity. For example, the rotation velocity may be slower than the movement velocity, when the rotation velocity is defined by a tangential velocity parallel to the scan path on an edge of the wafer. For example, an angular magnitude of the rotation velocity may be 360 P/Q degrees during a period that the wafer is moved through the scan path, wherein P is a positive integer and Q is also a positive integer.

(c) Control the wafer movement driver 802, such that a movement velocity is flexibly adjusted without the conventional limitation required by the prior art that the movement be higher close to the center of the wafer and lower close to an edge of the wafer.

(d) Calculate at least one (e.g., or more, or all) of the movement velocity profile and the rotation velocity profile as at least one (e.g., or more, or all) of the following: a constant; and a function of at least one (e.g., or more, or all) of the following factors: a current density distribution of the ion beam along the first axis, a current density distribution of the ion beam along the direction intersecting the first axis, a forecasted implanted dose distribution over the wafer, a net current density distribution along the first axis per a predetermined scan path, and a net current density distribution along a direction intersecting the first axis per a predetermined scan path.

(e) Adjust the movement velocity profile and the rotation velocity profile of each scan path when there are numerous scan paths to be scanned in sequence.

(f) Control the ion beam assembly 801, the wafer movement driver 802, and the wafer rotation driver 803 to repair error as the wafer crosses the ion beam. The repairing step is disclosed in FIG. 6 and the corresponding paragraphs.

(g) Control the ion beam assembly, the wafer movement driver 802, and the wafer rotation driver 803 to further repair secondary error during the process for repairing error. The error repairing step is disclosed in FIG. 7 and the corresponding paragraphs.

Additionally, the embodiment may optionally have a wafer tilting driver for tilting the wafer when the wafer crosses the ion beam, such that the channeling effect can be minimized and implantation uniformity can be improved. The wafer tilting driver can have at least four possible operations as discussed in the above embodiments. The tilt angle can be fixed or varying within a predetermined angle range, and the rotation axis can be parallel to the ion beam or vertical to the wafer.

Variations of the methods and the apparatus as described above may be realized by one skilled in the art. Although the methods and the apparatus have been described relative to specific embodiments thereof, the invention is not so limited. Many additional changes in the embodiments described and illustrated can be made by those skilled in the art. Accordingly, it will be understood that the present invention is not to be limited to the embodiments disclosed herein, can include practices other than specifically described, and is to be interpreted as broadly as allowed under the law.

What is claimed is:

1. A method of implanting a wafer, comprising:
    forming an ion beam in an elongated shape, wherein said shape has a length along a first axis longer than a diameter of said wafer and a width along a second axis shorter than said diameter of said wafer;
    moving a center of said wafer along a scan path intersecting said ion beam at a movement velocity and rotating said wafer at a rotation velocity simultaneously, wherein said wafer is totally overlapped with said ion beam along said first axis when said wafer intersects with said ion beam, and wherein said rotation velocity is slower than said movement velocity when said rotation velocity is defined by a tangential velocity parallel to said scan path on an edge of said wafer; and
    recording an error position and pausing said simultaneously moving and rotating step by immediately blocking said ion beam when an error of said ion beam is detected, and then continuing a movement and a rotation of said simultaneously moving and rotating step until said wafer stops at a first end of said scan path with said blocked ion beam.

2. The method as set forth in claim 1, wherein a shape of said scan path is chosen from one or more of straight-line and arc.

3. The method as set forth in claim 1, wherein said scan path is substantially parallel to said second axis.

4. The method as set forth in claim 1, wherein an angular magnitude of said rotation velocity is 360 P/Q degrees during a period that said wafer is moved through said scan path, wherein P is a positive integer and Q is also a positive integer.

5. The method as set forth in claim 1, wherein said simultaneously moving and rotating step is chosen from a group consisting of the following:
    moving said wafer with a faster movement velocity when said ion beam implants said center of said wafer and with a slower movement velocity when said ion beam implants an edge of said wafer;
    moving said wafer with a slower movement velocity when said ion beam implants said center of said wafer and with a faster movement velocity when said ion beam implants an edge of said wafer; and
    moving said wafer with about the same velocity regardless of whether said ion beam is implanting said center of said wafer or an edge of said wafer.

6. The method as set forth in claim 1, wherein two ends of a next said scan path are different than two ends of a previous said scan path when a movement of said wafer along said previous scan path is finished and a movement of said wafer along said next scan path is to begin.

7. The method as set forth in claim 1, wherein said movement velocity has a movement velocity profile relative to a position of said wafer across said ion beam and said rotation velocity has a rotation velocity profile relative to a position of said wafer across said ion beam.

8. The method as set forth in claim 7, further comprising a step of calculating one or more of said movement velocity profile and said rotation velocity profile as one or more of the following:
    a constant; and
    a function of one or more of the following factors: a current density distribution of said ion beam along said first axis, a current density distribution of said ion beam along said direction intersecting said first axis, a forecasted implanted dose distribution over said wafer, a net current density distribution along said first axis per a predetermined scan path, and a net current density distribution along a direction intersecting said first axis per a predetermined scan path.

9. The method as set forth in claim 7, wherein there are a plurality of said scan paths to be scanned in sequence, with different scan paths corresponding to different movement velocity profiles and rotation velocity profiles.

10. The method as set forth in claim 1, further comprising tilting said wafer when said wafer is simultaneously moved and rotated.

11. The method as set forth in claim 10, wherein said tilting step comprises one or more of the following:

tilting said wafer at a fixed tilt angle when said wafer is rotated around a direction parallel to said ion beam;

tilting said wafer and varying a tilt angle within a predetermined angle range when said wafer is rotated around a direction parallel to said ion beam;

tilting said wafer at a fixed tilt angle when said wafer is rotated around a direction vertical to said wafer; and tilting said wafer and varying a tilt angle within a predetermined angle range when said wafer is rotated around a direction vertical to said wafer.

12. An apparatus for ion implantation of a wafer with a center and a diameter, comprising:

an ion beam assembly constructed to provide an ion beam for implanting said wafer;

a wafer movement driver operative to move said center of said wafer along a scan path intersecting said ion beam at a movement velocity as said wafer crosses said ion beam, wherein said movement velocity has a movement velocity profile relative to a position of said wafer across said ion beam;

a wafer rotation driver operative to rotate said wafer at a rotation velocity as said wafer crosses said ion beam, wherein said rotation velocity has a rotation velocity profile relative to a position of said wafer across said ion beam; and a controller configured to operate said ion beam assembly, said wafer movement driver and said wafer rotation driver, such that said ion beam has an elongated shape having a length along a first axis longer than said diameter of said wafer and a width along a second axis shorter than said diameter of said wafer, such that said wafer is totally overlapped with said ion beam along said first axis as said wafer crosses said ion beam, wherein said controller adjusts said rotation velocity to be slower than said movement velocity when said rotation velocity is defined by a tangential velocity parallel to said scan path on an edge of said wafer;

wherein said controller further records an error position and pauses said simultaneously moving and rotating step by immediately blocking said ion beam when an error of said ion beam is detected, and then continues a movement and a rotation of said simultaneously moving and rotating step until said wafer stops at a first end of said scan path with said blocked ion beam.

13. The apparatus as set forth in claim 12, wherein said controller adjusts an angular magnitude of said rotation velocity to be 360 P/Q degrees during a period that said wafer is moved through said scan path, wherein P and Q are each positive integers.

14. The apparatus as set forth in claim 12, wherein a configuration of said wafer movement driver controlled by said controller is arranged to enable one or more of:

moving said wafer with a faster movement velocity when said ion beam implants said center of said wafer and with a slower movement velocity when said ion beam implants an edge of said wafer;

moving said wafer with a slower movement velocity when said ion beam implants said center of said wafer and with a faster movement velocity when said ion beam implants an edge of said wafer; and moving said wafer with essentially a similar velocity when said ion beam implants both said center of said wafer and an edge of said wafer.

15. The apparatus as set forth in claim 12, wherein said controller calculates one or more of said movement velocity profile and said rotation velocity profile as one or more of the following:

a constant; and a function of one or more of the following factors: a current density distribution of said ion beam along said first axis, a current density distribution of said ion beam along said direction intersecting said first axis, a forecasted implanted dose distribution over said wafer, a net current density distribution along said first axis per a predetermined scan path, and a net current density distribution along a direction intersecting said first axis per a predetermined scan path.

16. The apparatus as set forth in claim 12, wherein said controller adjusts said movement velocity profile and said rotation velocity profile of each said scan path when there are a plurality of said scan paths to be scanned in sequence.

17. The apparatus as set forth in claim 12, further comprising a wafer tilting driver for tilting said wafer when said wafer crosses said ion beam, wherein said wafer tilting driver is configured to be controlled by said controller to effectuate one or more of the following:

tilting of said wafer at a fixed tilt angle when said wafer is rotated around a direction parallel to said ion beam;

tilting of said wafer when varying a tilt angle within a predetermined angle range and rotating said wafer around a direction parallel to said ion beam;

tilting of said wafer at a fixed tilt angle when said wafer is rotated around a direction vertical to said wafer; and tilting of said wafer when varying a tilt angle within a predetermined angle range and rotating said wafer around a direction vertical to said wafer.

18. A method of implanting a wafer, comprising:

forming an ion beam in an elongated shape, wherein said shape has a length along a first axis longer than a diameter of said wafer and a width along a second axis shorter than said diameter of said wafer;

moving a center of said wafer along a scan path intersecting said ion beam at a movement velocity and rotating said wafer at a rotation velocity simultaneously, wherein said wafer is totally overlapped with said ion beam along said first axis when said wafer intersects with said ion beam, and wherein said rotation velocity is slower than said movement velocity when said rotation velocity is defined by a tangential velocity parallel to said scan path on an edge of said wafer; and repairing error during said simultaneously moving and rotating step, comprising:

recording an error position and pausing said simultaneously moving and rotating step by immediately blocking said ion beam when an error of said ion beam is detected;

continuing a movement and a rotation of said simultaneously moving and rotating step until said wafer stops at a first end of said scan path with said ion beam blocked;

unblocking said ion beam and continuing both said movement and said rotation with reversed direction;

blocking said ion beam at said error position and continuing said reversed movement and said reversed rotation until said wafer stops at a second end of said scan path;

moving and rotating said wafer with said ion beam blocked, until said wafer stops at said first end of said scan path; and unblocking said ion beam and resuming said simultaneously moving and rotating step.

19. The method as set forth in claim 18, wherein said error is a glitch or an instability of an ion beam.

20. The method as set forth in claim 18, further comprising a step of ensuring a state of said unblocked ion beam before said unblocked ion beam is implanted into said wafer, wherein a standard of said state of said unblocked ion beam is essentially equal to a state of said ion beam before an appearance of said errors.

21. The method as set forth in claim 20, further comprising a step of ensuring a state of said unblocked ion beam before said unblocked ion beam is implanted into said wafer, wherein a standard of said state of said unblocked ion beam is essentially equal to a state of said ion beam before an appearance of said errors.

22. The method as set forth in claim 18, further comprising a step of repairing secondary error during said repairing step, comprising:
    recording a secondary error position during said reversed movement and said reversed rotation, and immediately stopping said repairing step by blocking said ion beam when a secondary error is detected;
    continuing said reversed movement and said reversed rotation of said wafer until said wafer stops at said second end of said scan path with said ion beam blocked;
    performing both said movement and said rotation until said wafer reaches said error position with said ion beam blocked;
    unblocking said ion beam and performing both said movement and said rotation of said wafer until said wafer reaches said secondary error position;
    blocking said ion beam and then continuing both said movement and said rotation until said wafer stops at said first end of said scan path with said ion beam blocked; and
    unblocking said ion beam and resuming said simultaneously moving and rotating step.

23. An apparatus for ion implantation of a wafer with a center and a diameter, comprising:
    an ion beam assembly constructed to provide an ion beam for implanting said wafer;
    a wafer movement driver operative to move said center of said wafer along a scan path intersecting said ion beam at a movement velocity as said wafer crosses said ion beam, wherein said movement velocity has a movement velocity profile relative to a position of said wafer across said ion beam;
    a wafer rotation driver operative to rotate said wafer at a rotation velocity as said wafer crosses said ion beam, wherein said rotation velocity has a rotation velocity profile relative to a position of said wafer across said ion beam;
    a controller configured to operate said ion beam assembly, said wafer movement driver and said wafer rotation driver, such that said ion beam has an elongated shape having a length along a first axis longer than said diameter of said wafer and a width along a second axis shorter than said diameter of said wafer, such that said wafer is totally overlapped with said ion beam along said first axis as said wafer crosses said ion beam, wherein said controller adjusts said rotation velocity to be slower than said movement velocity when said rotation velocity is defined by a tangential velocity parallel to said scan path on an edge of said wafer;
    wherein said controller further repairs error as said wafer crosses said ion beam, by performing the following:
        recording an error position and pausing said simultaneously moving and rotating step by immediately blocking said ion beam when an error of said ion beam is detected;
        continuing a movement and a rotation of said simultaneously moving and rotating step until said wafer stops at a first end of said scan path with blocked ion beam;
        unblocking said ion beam and continuing both said movement and said rotation with reversed direction;
        blocking said ion beam at said error position and continuing said reversed movement and said reversed rotation until said wafer stops at a second end of said scan path;
        moving and rotating said wafer with blocked ion beam, until said wafer stops at said first end of said scan path; and
        unblocking said ion beam and resuming said simultaneously moving and rotating step.

24. The apparatus as set forth in claim 23, wherein said controller further repairs secondary error during said repairing error, said secondary repairing comprising:
    recording a secondary error position during said reversed moment and said reversed rotation, and stopping said repairing step by immediately blocking said ion beam when a secondary error of said ion beam is detected;
    finishing said reversed movement and said reversed rotation of said wafer until said wafer stops at said second end of said scan path with blocked ion beam;
    performing both said movement and said rotation until said wafer reaches said error position with blocked said ion beam;
    unblocking said ion beam and performing both said movement and said rotation of said wafer until said wafer reaches said secondary error position;
    blocking said ion beam and then continuing both said movement and said rotation until said wafer stops at said first end of said scan path with blocked ion beam; and
    unblocking said ion beam and resuming said simultaneously moving and rotating step.

* * * * *